United States Patent [19]
Bays et al.

[11] Patent Number: 5,287,296
[45] Date of Patent: Feb. 15, 1994

[54] CLOCK GENERATORS HAVING PROGRAMMABLE FRACTIONAL FREQUENCY DIVISION

[75] Inventors: Laurence E. Bays, Allentown; Steven R. Norsworthy, Emmaus, both of Pa.

[73] Assignee: AT&T Bell Laboratories, Murray Hill, N.J.

[21] Appl. No.: 871,945

[22] Filed: Apr. 22, 1992

[51] Int. Cl.⁵ .............................................. G06F 7/52
[52] U.S. Cl. ........................................ 364/703; 377/47
[58] Field of Search .................. 364/703, 701; 377/47

[56] References Cited

U.S. PATENT DOCUMENTS

| | | | |
|---|---|---|---|
| 4,241,408 | 12/1980 | Gross | 364/703 |
| 4,244,027 | 1/1981 | Shai | 364/703 |
| 4,413,350 | 11/1983 | Bond et al. | 364/703 X |
| 4,837,721 | 6/1989 | Carmichael et al. | 364/703 |
| 5,052,031 | 9/1991 | Malloy | 375/120 |
| 5,088,057 | 2/1992 | Amrany et al. | 364/703 |

OTHER PUBLICATIONS

Nussbaumer, Henri J., "Fast Fourier Transform and Convolution Algorithms", Springer-Verlag, 1982, pp. 4–7.

*Primary Examiner*—Tan V. Mai
*Attorney, Agent, or Firm*—Michael J. Urbano

[57] ABSTRACT

A clock generator is described for generating an output clock frequency from an input clock frequency where the frequencies of the clocks are not integrally related. The division process is designed using the quotients of the Euclidean theorem for determining the greatest common divisor of two integers in such a way as to alleviate the adverse effects of jitter. Applications to oversampled sigma-delta codecs are described.

9 Claims, 2 Drawing Sheets

CLOCK GENERATORS HAVING PROGRAMMABLE FRACTIONAL FREQUENCY DIVISION

BACKGROUND OF THE INVENTION

This invention relates to fractional frequency division for use in clock generators and, more particularly, to such clock generators for use in sampled data communication systems such as those employing oversampled analog-to-digital (A/D) and digital-to-analog (D/A) converters.

A modern communication system, such as a synchronous digital receiver or an oversampled A/D or D/A converter, typically requires the generation of different clock frequencies, the least common multiple (LCM) of which may be too high a frequency to generate practically. As a result, a high frequency reference, less than the LCM, is chosen such that fractional division may be used in order to generate some of the desired frequencies for the system. However, fractional division results in objectionable timing jitter in many instances.

An alternative to fractional division is to use multiple independent reference frequencies. This requires a phase locked loop (PLL) to synchronize the various frequencies in the system together. Clock jitter generally is present in a PLL, but at a much lower level than in a fractional divider. The penalty of such a scheme is additional cost and complexity. Various attempts have been made to generate fractionally divided clocks in a manner which reduces the jitter for a given set of divisors. One example is given in N. J. Malloy in U.S. Pat. No. 5,052,031 issued on Sep. 24, 1991. The output clock FOUT of the PLL is not an integral multiple of the reference clock FTB and typically has jitter, a fundamental by-product of the clock division process. More specifically, FOUT is generated in the Malloy patent by dividing FTB in each time interval by one of two integral divisors which are alternated in a predetermined sequence. The alternating of the divisors is done "as often as possible and in as uniform a manner as possible" so as to alleviate the adverse effects of jitter. Beyond these general guidelines, however, no specific criteria are provided for determining the optimum sequence of divisors for reducing the effects of jitter. Rather, the sole example for generating a 1.544 MHz output clock FOUT from a 51.84 MHz reference clock FTB entails an empirically determined sequence of dividing FTB by two divisors (33 and 34) over 193 time intervals.

Thus, there remains a need in the prior art for a deterministic technique for generating a sequence of divisors which alleviates the adverse effects of jitter for a given pair of divisors and for a given output clock frequency which is a non-integral multiple of an input clock frequency.

SUMMARY OF THE INVENTION

In accordance with a general embodiment of the invention, a clock generator includes means for dividing an input clock frequency in each time interval by one of two integral divisors and means for alternating the divisors in a sequence determined by quotients of the Euclidean greatest common divisor theorem. This approach insures that the adverse effects of jitter in the output clock frequency are alleviated for a given pair of divisors.

In a preferred embodiment for use in an oversampled A/D or D/A converter (e.g., in a codec), the oversampling clock is not integrally related to an input clock and is generated from the input clock by the above technique. More specifically, the means for alternating divisors includes a chain of interdependent counters in which each counter either increments or decrements the preceding counter in accordance with the Euclidean quotients.

An important advantage of our invention is that it is deterministic and hence programmable for a wide variety of different frequencies and different divisors. In the case of a codec, for example, the invention provides flexibility in matching the codec input clock frequency to the system clock frequency without the need for a PLL or other expensive schemes, even though the input and system clock frequencies are not integral multiples of one another.

BRIEF DESCRIPTION OF THE DRAWINGS

The invention, together with its various features and advantages, can be readily understood from the following more detailed description taken in conjunction with accompanying drawing, in which.

DETAILED DESCRIPTION

Figure 1:
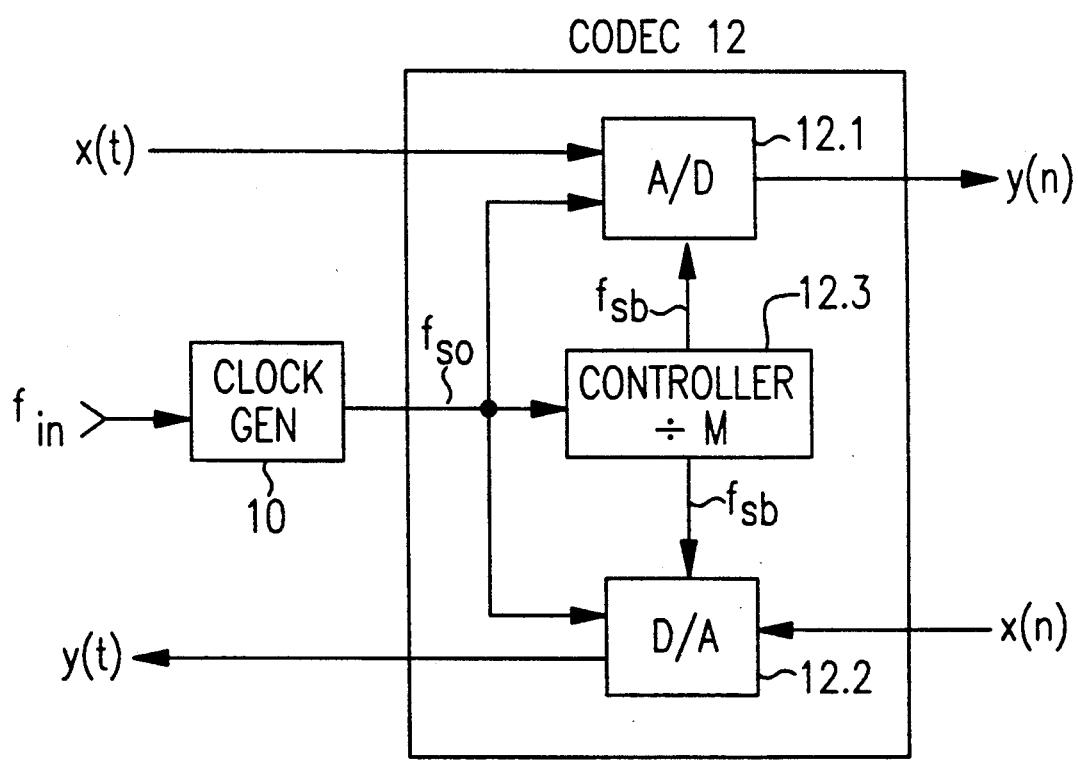
FIG. 1 is a block diagram of a sigma-delta codec in which a clock generator generates an oversampling clock $f_{so}$ from an input clock $f_{in}$.

Before discussing in detail the various embodiments of the invention, it will be instructive to consider first the Euclidean theorem which forms the principal basis for their implementation.

Euclidean Theorem

The Euclidean theorem for finding the greatest common integral divisor, d, which divides two integers, a and b (a>b), is described by H. J. Nussbaumer in *Fast Fourier Transforms and Convolution Algorithms*, Springer-Verlag (1982), pp. 4–7, in terms of the quotients $q_k$ and remainders $r_k$ as follows:

$$a = bq_1 + r_1, r_1 < b \quad (1)$$
$$b = r_1q_2 + r_2, r_2 < r_1 \quad (2)$$
$$r_1 = r_2q_3 + r_3, r_3 < r_1 \quad (3)$$
$$\ldots$$
$$r_{k-2} = r_{k-1}q_k + r_k, r_k < r_{k-1} \quad (4)$$
$$r_{k-1} = r_kq_{k+1} + 0. \quad (5)$$

The penultimate remainder $r_k = d$ is the greatest integral divisor of integers a and b, and the quotients $q_k$ (k=1, 2, ...) are used to determine the sequence of alternating a pair of divisors N and N+1 (or N−1 and N) of an input clock in a manner to alleviate the adverse effects of jitter in an output clock.

In applying the theorem to the design of our invention, the remainders may be chosen to be either positive or negative, except the last remainder which is zero. Accordingly, we have found that the left hand side of equations (3) to (5) should be the absolute values $|r_i|$, i=1, 2 ... (k−1). For reasons described later, we have also found that the following criteria should be satisfied in steps (2) to (5):

$$|r_k| \leq \tfrac{1}{2}|r_{k-1}| \text{ and } |r_1| \leq \tfrac{1}{2}b \quad (6)$$

When these principles are applied to the general design of a clock generator, it follows that $f_{out}=f_{in}/(a/b)$, where $f_{in}$ and $f_{out}$ are the input and output frequencies of the generator, respectively. The application of these principles to the design of a sigma-delta codec is described below where the oversampling clock frequency $f_{so}=f_{out}$.

Sigma-Delta Codec

An oversampled sigma-delta codec 12 is shown in simplified form in FIG. 1 for converting an analog signal x(t) to a digital (i.e., PCM) signal y(n), and conversely. The codec 12 comprises a controller 12.3 coupled to both an A/D converter 12.1 and a D/A converter 12.2, as well as to a clock generator 10. An input clock $f_{in}$ is applied to clock generator 10, typically a divide-by-N counter, which divides the input clock frequency by an integer N to generate an oversampling clock $f_{so}$. The latter is applied to controller 12.3 which, in turn, supplies a baseband sampling clock $f_{sb}$ to each converter. Inasmuch as the controller has a decimation factor $M=f_{so}/f_{sb}$, it follows that $f_{in}=NMf_{sb}$.

A problem occurs, however, when the incoming clock $f_{in}$ is not an integral multiple of the required oversampling clock frequency $f_{so}$ (but is still a multiple of the required baseband sampling frequency $f_{sb}$). In such cases, the clock generator can no longer be a simple divide-by-N counter; rather, it typically is a more complex design in which $f_{in}$ is divided by one of two divisors N, N+1 (or N−1, N) in each sampling time interval. As mentioned previously, this approach gives rise to jitter in $f_{so}$. In order to alleviate the adverse effects of jitter for a given pair of divisors, the sequence of the two divisors is determined in accordance with the Euclidean theorem discussed above.

In particular, application of the theorem to the design of an oversampling sigma-delta codec begins with identifying the integers, a and b, with the parameters of the codec, as follows:

$$a=f_{in}/f_{sb} \tag{7}$$

$$b=M=f_{so}/f_{sb} \tag{8}$$

Equations (7) and (8) are substituted into equation (1), and the calculations of equations (1) to (5) are carried out until a zero remainder is obtained. Then, the quotient $q_1$ equals the divisor N, and the quotients $q_k$ (k=2, 3, ...) determine the desired sequence of the divisors N and N+1 (or N−1, N).

In general, the desired sequence of divisors is determined by first defining the integral divisors $S_1$ and $S_1'$ as follows:

$$S_1=q_1=N \tag{9}$$

$$S_1'=N+1, \text{ if } q_2>0, \text{ but} \tag{10}$$

$$S_1'=N-1, \text{ if } q_2<0, \text{ and} \tag{11}$$

The sequence $S_2$ is defined as $$S_2=(N)^{|q_2|-1}, (N+1), \text{ if } q_2>0, \text{ but} \tag{12}$$

$$S_2=(N)^{|q_2|-1}, (N-1), \text{ if } q_2<0, \tag{13}$$

where the exponent means that the integral divisor N is repeated $|q_k|-1$ times, but the integral divisor (N+1) or (N−1) is used only once. Likewise, for each $\underline{k}(k>2)$ and $q_k \neq 0$, the sequence $S_k$ is given by $$S_k=(S_{k-1})^{|q_k|-1}, S'_{k-1} \tag{14}$$

where we define the exponent as meaning that the sequence in parenthesis (i.e., $S_{k-1}$) is repeated $|q_k|-1$ times, but the divisor $S'_{k-1}$ is used only once. Continuing in this fashion, if $q_{k+1}>0$, $$S'_{k-1}=(S_{k-1})^{|q_k|}, S'_{k-1}, \text{ and} \tag{15}$$

if $q_{k+1}<0$, $$S'_k=(S_{k-1})^{|q_k|-2}, S'_{k-1} \tag{16}$$

Another way to view the overall sequence is as follows: there are $q_2-1$ clock intervals with duration $N/f_{in}$; at the $q_2$-th interval N is incremented by 1 to N+1 (or decremented to N−1, depending on the sign of $q_2$), and so the first $q_2-1$ intervals are followed by 1 clock interval with duration $(N+1)/f_{in}$. This sequence is repeated $q_2-1$ times. Just before the beginning of the $q_3$-th sequence, $q_2-1$ is decremented by 1 to $q_2-2$ (or incremented to $q_2$ if $q_3$ is positive), and so the next sequence is $q_2-2$ clock intervals with duration $N/f_{in}$ followed by one clock interval with duration $N+1/f_{in}$, and so on for $q_4$ and higher q's, if any. This overall sequence generates a total of M clock intervals covering a total period of $T=1/f_{sb}$ and repeats at the rate of $f_{sb}$. A numerical example described later will help to clarify these sequences.

Figure 2:
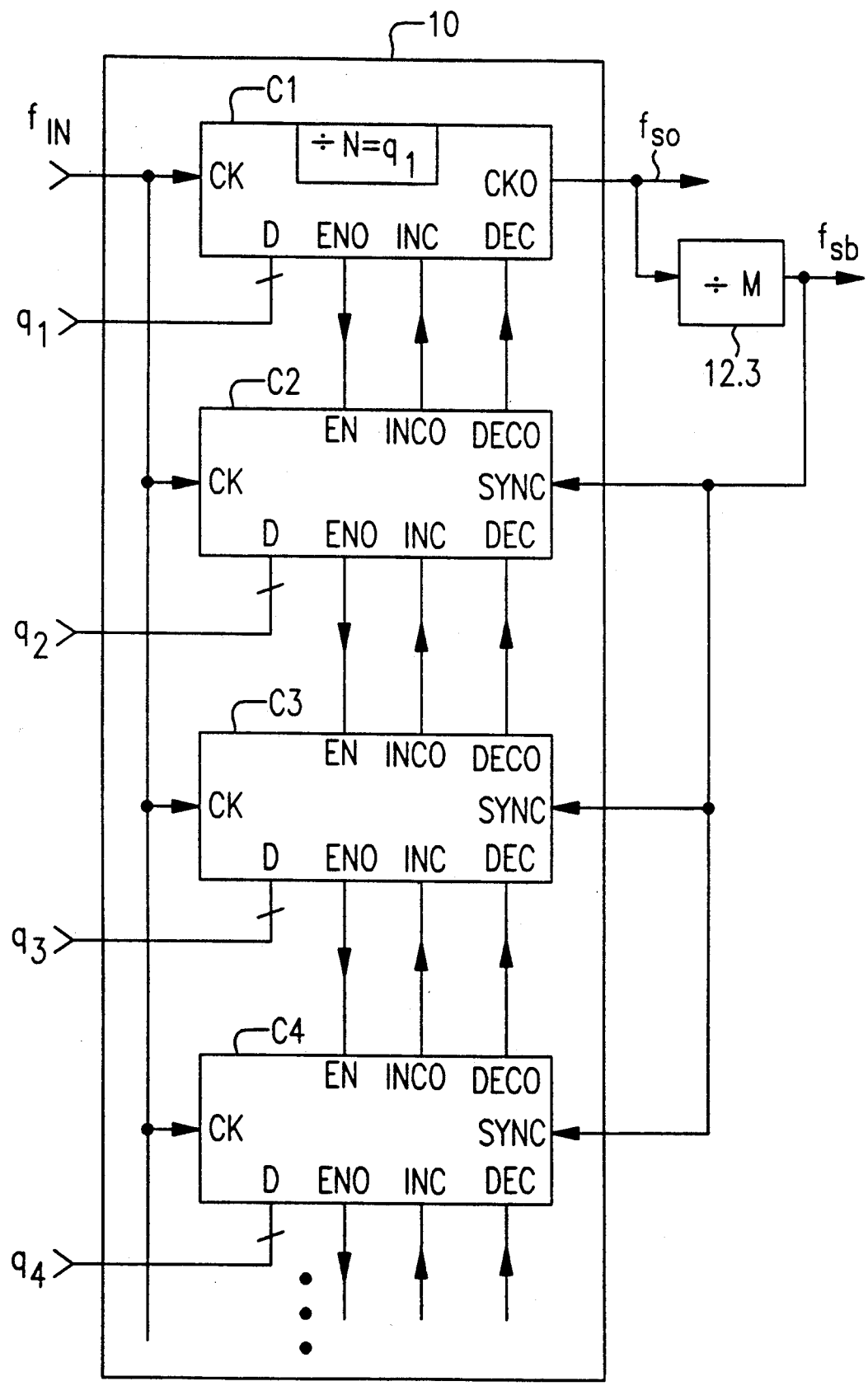
FIG. 2 is a block diagram, in accordance with a preferred embodiment of the invention, in which the clock generator of FIG. 1 is implemented as a chain of counters.

One design which implements the desired sequence of divisors so as to alleviate the effects of jitter is shown in FIG. 2. The clock generator 20 comprises a chain of counters C1, C2, C3, C4 ... in which the respective counter parameters $q_1$, $q_2$, $q_3$, $q_4$ ... are the quotients derived from application of the Euclidean theorem to the integers defined in equations (7) and (8).

Divide-by-N counter C1 divides input clock $f_{in}$ by N or by N+1 (or N−1, N) as determined by sequence counter C2; i.e., by the increment (INC) or decrement (DEC) inputs to C1 from the corresponding outputs INCO and DECO of C2. Likewise, sequence counter C3 controls the sequencing of counter C2, sequence counter C4 controls the sequencing of counter C3, and so on.

From an interconnection standpoint, each counter has (1) the input clock applied to its clock CK input, (2) a quotient input terminal D, and (3) an enable output ENO. Counters C2, C3, C4 ... also have (1) the baseband sampling clock $f_{sb}$ (optionally) applied to their synchronizing SYNC inputs, and (2) enable inputs EN. Finally, the output clock terminal CKO of counter C1 supplies the oversampling clock $f_{so}$ to controller 12.3.

For any given set of parameters $f_{in}/f_{sb}$ and M, the number of counters required of the clock generator depends on how the calculations associated with the Euclidean theorem are carried out; i.e., the fewer the number of steps required to reach a zero remainder, the fewer the number of counters required. To this end, both positive and negative remainders $r_k$ need to be investigated, and the criterion of equation (6) should be satisfied in each step.

It was noted above that applying $f_{sb}$ to the SYNC inputs is optional. There is, however, a situation in which the SYNC input is desirable; that is, when the greatest common divisor d=1 (i.e., when a and b are mutually prime numbers), then the last quotient $|q_k|$ may be allowed to be slightly smaller than the calculated value because the last sequence occurs only once in each period of $f_{sb}$. In some cases, in fact, the last $q_k$ (and hence the counter corresponding to it) could be omitted altogether. Nevertheless, these alternative designs are considered to be within the scope of the invention.

EXAMPLE I

This example describes the design of an oversampled codec in which $f_{in}=2.048$ MHz, $f_{sb}=8$ kHz and $M=125$. From equations (7) and (8) it follows that $a=256$ and $b=125$. Substituting these values in equation (1) and carrying out the calculations yields:

$$256=125(2)+6 \tag{17}$$

$$125=6(21)-1 \tag{18}$$

$$6=-1(-6)+0 \tag{19}$$

The numbers in parenthesis are the quotients which determine the divisor $N=q_1=2$ and the sequencing parameters $q_2=21$ and $q_3=-6$. The resulting sequence is as follows: 20 clock intervals with duration 2/2.048 MHz; at the 21st interval ($q_2=21$) N is incremented by 1 to $N=3$, and so the first 20 intervals are followed by 1 clock interval with duration 3/2.048 MHz. This sequence is repeated five times. Just before the beginning of the sixth sequence ($|q_3|=6$), $q_2$ is decremented by 1 to 19 because the sign of $q_3$ is negative, and so the next (and last) sequence is 19 clock intervals each with duration 2/2.048 MHz followed by one clock interval with duration 3/2.048 MHz. This overall sequence generates a total of 125 clock intervals covering a total period of 125 μs ($1/f_{sb}$) and repeats at the rate of $f_{sb}=8$ kHz.

In accordance with a preferred embodiment of the invention, the above sequence has been designed into a clock generator of the type shown in FIG. 2 in which $q_1=N=2$ was applied to the first counter C1, $q_2=21$ was applied to the second counter C2, and $q_3=-6$ was applied to the third counter C3. The fourth counter C4 was not used.

From a jitter standpoint, when the clock generator was used in a sigma-delta codec, the sidetone images were first measured by computer simulation; i.e., the noise or distortion products at $nf_{sb}\pm f_a$, where n is an integer, were simulated for an analog signal x(t) being a sinusoid of frequency $f_a=3$ kHz. When the six clock intervals of 3/2.048 MHz were spread out as described above, the sidetone images were more than 80 dB below the analog input level. These simulations were confirmed in actual codecs. In contrast, simulations in which the six clock intervals of 3/2.048 MHz were grouped (e.g., at the end of each clock cycle) showed that the sidetone images were only 45 dB below the analog input level, too high for many applications.

EXAMPLE II

Example I was repeated for $a=256$ and $M=125$ except, for purposes of illustration, the condition that $|r_{k+1}|\leq \kappa |r_k|$ was omitted to demonstrate a potentially undesirable result:

$$256=125(2)+6 \tag{20}$$

$$125=6(20)+5 \tag{21}$$

$$6=5(1)+1 \tag{22}$$

$$5=1(5)+0 \tag{23}$$

Note the absolute value of the remainder 5 is not $\leq \frac{1}{2}$ of the absolute value of the remainder 6. This calculation indicates a design which includes four counters in which $q_1=N=2$, $q=20$, $q_3=1$, and $q_4=5$. In contrast with Example I, this design requires more equipment, hence more chip area and higher cost. In addition, the third counter increments the second counter at every interval since $q_3=1$, rendering its utilization somewhat dubious.

EXAMPLE III

This example describes an oversampled codec of the type shown in FIG. 2 in which $f_{in}=23.328$ MHz, $f_{sb}=8$ kHz and $M=125$, thus $f_{in}/f_{sb}=2916$. Using the calculations of equations (1) to (8), it can be shown that $q_1=N=23$, $q_2=3$, $q_3=20$, and $q_4=2$, or equivalently $q_1=N=23$, $q_2=3$, $q_3=21$, and $q_4=-2$.

Computer simulations in this case also demonstrated sidetone images at 80 dB below the input level.

EXAMPLE IV

This example describes a digital phase locked loop of the type described in the Malloy patent above. In this case, $a=$ FTB/PHCLK $=51.84$ MHz/8 kHz $=6480$ and $b=N$ (of Malloy's counter 28) $=193$. Using equations (1) to (8), it can be shown that $q_1=N=34$, $q=-2$, $q_3=-3$, $q_4=6$, and $q_5=-6$. The sequence defined by these quotients does not generate the same sequence as shown in Malloy's Table I and, it is expected, would better alleviate the effects of jitter.

It is to be understood that the above-described arrangements are merely illustrative of the many possible specific embodiments which can be devised to represent application of the principles of the invention. Numerous and varied other arrangements can be devised in accordance with these principles by those skilled in the art without departing from the spirit and scope of the invention. In particular, although various embodiments of our invention have been demonstrated using a chain of counters of the type shown in FIG. 2, those skilled in the art will readily appreciate that the sequences defined by the Euclidean quotients can be implemented in other forms of hardware, software, or both; e.g., in a state machine (such as one designed from a programmed logic array), or in a microcontroller (such as one with software control).

We claim:

1. A clock generator for generating an output clock signal at an output frequency from an input clock signal at an input frequency, comprising:

means for dividing said input frequency by one of two first integers in each of a plurality of successive time intervals so as to generate said output frequency which is not an integral multiple of said input frequency, and means for alternating between said two first integers in a sequence determined by the quotients of the Euclidean theorem for determining the greatest common divisor of two second integers.

2. The clock generator of claim 1 wherein said dividing means comprises a divide-by-N counter, wherein N is one of said first integers and N+1 or N−1 is the other of said first integers, and said alternating means comprises at least one sequence counter coupled to control when said divide-by-N counter divides said input frequency by N and when it divides by N−1 or N+1, each of said at least one sequence counters having a sequence parameter equal to a separate one of said Euclidean quotients.

3. A sampled data system comprising:

an oversampled codec which includes an A/D converter, a D/A converter, and a controller which (1) receives an oversampling clock frequency $f_{so}$, (2) divides $f_{so}$ by a decimation factor M to generate a baseband sampling frequency $f_{sb}$, and (3) supplies $f_{sb}$ to each of said converters, and a clock generator which (1) receives an input clock frequency $f_{in}$, (2) generates therefrom said oversampling clock frequency $f_{so}$, and (3) supplies $f_{so}$ to said controller and said converters, said clock generator comprising a generator according to either claim 1 or claim 2 in which said two first integers are $f_{in}/f_{sb}$ and M.

4. The system of claim 3 wherein each of said counters has a clock input to which $f_{in}$ is applied, said divide-by-N counter has a clock output from which $f_{so}$ is supplied to said controller, and each of said sequence counters has a synchronizing input to which $f_{sb}$ is applied.

5. A sampled data system comprising an oversampled A/D converter and or a D/A converter, a controller which (1) receives an oversampling clock frequency $f_{so}$, (2) divides $f_{so}$ by a decimation factor M to generate a baseband sampling frequency $f_{sb}$, and (3) supplies $f_{sb}$ to said converter, and a clock generator which (1) receives an input clock frequency $f_{in}$, (2) generates therefrom said oversampling clock frequency $f_{so}$, and (3) supplies $f_{so}$ to said controller and said converter, said clock generator comprising a generator according to either claim 1 or claim 2 in which said two first integers are $f_{in}/f_{sb}$ and M.

6. The system of claim 5 wherein each of said counters has a clock input to which $f_{in}$ is applied, said divide-by-N counter has a clock output from which $f_{so}$ is supplied to said controller, and each of said sequence counters has a synchronizing input to which $f_{sb}$ is applied.

7. A method of generating an output clock signal at an output frequency from an input clock signal at an input frequency comprising the steps of:

dividing said input frequency by one of two first integers in each of a plurality of successive time intervals so as to generate said output frequency which is not an integral multiple of said input frequency, characterized by alternating between said two first integers in a sequence determined by the quotients of the Euclidean theorem for determining the greatest common divisor of two second integers.

8. The method of claim 7 wherein said dividing step comprises dividing said input frequency by N, wherein N is one of said first integers and N+1 or N−1 is the other of said first integers, and said alternating step comprises controlling when said input frequency is divided by N and when it is divided by N−1 or N+1, said controlling step being determined by said quotients of said Euclidean theorem.

9. The method of claims 7 or 8 for use in a sampled data system including a clock generator and an oversampled A/D and/or D/A converter, comprising the steps of:

applying said input frequency ($f_{in}$) to the clock generator, and applying said output frequency ($f_{so}$) of the generator to the converter, which produces or receives a data signal at a baseband frequency ($f_{sb}$), wherein said first integer is $f_{in}/f_{so}$ and said second integer is $f_{so}/f_{sb}$.

* * * * *